United States Patent
Zhang (10) Patent No.: US 10,747,100 B2
(45) Date of Patent: Aug. 18, 2020

(54) PATTERN STRUCTURE AND EXPOSURE METHOD OF PATTERNED SAPPHIRE SUBSTRATE MASK

(71) Applicant: SHANGHAI MICRO ELECTRONICS EQUIPMENT (GROUP) CO., LTD., Shanghai (CN)

(72) Inventor: Lei Zhang, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 170 days.

(21) Appl. No.: 16/080,396

(22) PCT Filed: Feb. 27, 2017

(86) PCT No.: PCT/CN2017/075010
§ 371 (c)(1),
(2) Date: Aug. 28, 2018

(87) PCT Pub. No.: WO2017/148350
PCT Pub. Date: Sep. 8, 2017

(65) Prior Publication Data
US 2019/0339611 A1    Nov. 7, 2019

(30) Foreign Application Priority Data
Feb. 29, 2016    (CN) .......................... 2016 1 0113391

(51) Int. Cl.
*G03F 1/90*    (2012.01)
*G03F 7/20*    (2006.01)
*G03F 1/42*    (2012.01)
*G03F 1/50*    (2012.01)

(52) U.S. Cl.
CPC ................. *G03F 1/42* (2013.01); *G03F 1/50* (2013.01); *G03F 1/90* (2013.01); *G03F 7/2022* (2013.01)

(58) Field of Classification Search
CPC ................. G03F 1/42; G03F 1/50; G03F 1/90
USPC ............................................. 430/5
See application file for complete search history.

(56) References Cited

U.S. PATENT DOCUMENTS

2012/0156814 A1    6/2012   Hsieh et al.

FOREIGN PATENT DOCUMENTS

| CN | 102520576 B | 6/2012 |
|---|---|---|
| CN | 202563242 U | 11/2012 |
| CN | 103337566 A | 10/2013 |
| CN | 103365070 A | 10/2013 |
| CN | 103412468 A | 11/2013 |
| CN | 103576440 A | 2/2014 |
| CN | 104698769 A | 6/2015 |
| CN | 103869606 B | 6/2016 |
| EP | 0936505 A1 | 8/1999 |
| TW | M427591 | 4/2012 |

*Primary Examiner* — Christopher G Young
(74) *Attorney, Agent, or Firm* — Muncy, Geissler, Olds & Lowe, P.C.

(57) ABSTRACT

A pattern structure of a photomask for a patterned sapphire substrate (PPS) and an exposure method are disclosed. The pattern structure is formed by stitching a plurality of identical polygons each including at least two sector-shaped opaque areas (7) and one transparent area (2). The polygons are joined together by stitching the sector-shaped opaque areas (7) into round opaque areas (1). Boundary areas of the photomask that are unable to accommodate a complete one of the polygons are configured as opaque areas (1). This pattern structure ensures that the round opaque areas (1) near the frames will not be affected by lighting conditions. During the exposure of another identical PSS photomask pattern, it only needs to superimpose it with the first photomask pattern at their frames to allow the part other than the frame to be exposed. In this way, the photomask pattern and exposure method solves the problem of blurred pattern image edges arising from excessively narrow gaps between photomask frames and opaque areas (1).

7 Claims, 6 Drawing Sheets

PATTERN STRUCTURE AND EXPOSURE METHOD OF PATTERNED SAPPHIRE SUBSTRATE MASK

TECHNICAL FIELD

The present invention relates to the field of semiconductor photolithography and, in particular, to a patterned sapphire substrate (PSS) photomask pattern and an exposure method.

BACKGROUND

In the fabrication of LEDs, the adoption of patterned sapphire substrates (hereinafter referred to as PSS) can help to achieve reduced internal light loss, enhanced lateral light extraction, less heat generation, extended life spans and a much milder lattice mismatch between sapphire and gallium nitride (GaN) of the LEDs. Therefore, the existing PSS technologies have been widely used in the LED industry. Due to the demanding PSS requirements for pattern uniformity, steppers are usually used for the exposure of the patterns.

Figure 1:
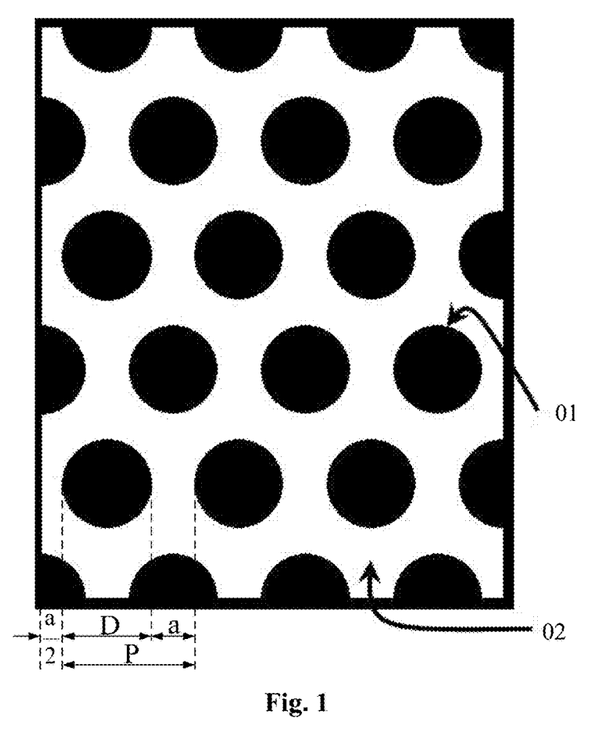
FIG. 1 is a schematic illustration of a conventional PSS photomask pattern.

At present, most common PSS patterns are arranged in a 60°-, 120°- or 180°-array, as shown in FIG. 1. However, steppers often perform exposure orthogonally in an X-Y coordinate system. Therefore, photomasks adopted in steppers usually assume a rectangular shape with chrome-plated opaque areas 01 that do not allow the passage of light from the light source and a transparent area 02 that is not plated with chrome and allows light from the light source to transmit through the transparent area 02. The photomask has a rectangular shape and the four sides thereof constitute boundaries of the photomask. As shown in the figure, some opaque areas 01 are cut by the boundaries of the photomask into halves. Generally, the round opaque areas 01 have a diameter of 2-2.3 µm and a minimum allowable pitch of 3 µm. With such a conventional pattern, an optical proximity effect (OPE) may be given rise due to excessively narrow gaps between the boundaries of the photomask and the nearby round opaque areas 01.

Figure 2:
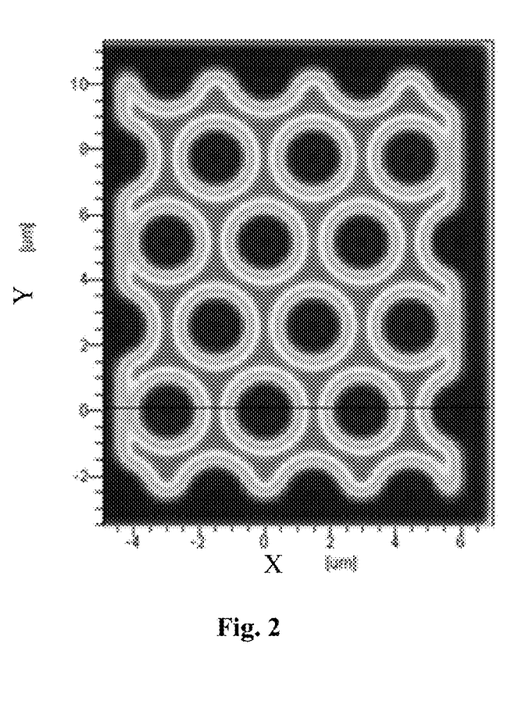
FIG. 2 shows a light intensity distribution of an image of the photomask pattern of FIG. 1.

If P represents a recurrence period of the round opaque areas 01, D represents the diameter of the round opaque areas 01, and a represents the pitch between adjacent round opaque areas 01, then a=P−D. In the pattern of FIG. 1, a boundary of the photomask may traverse gaps that define the pitch a, so that the boundary is spaced apart from the nearest round opaque areas 01 by a distance of only a/2. Generally, P=3 µm and D ranges from 2 µm to 2.3 µm, so a/2 ranges from 0.35 µm to 0.5 µm. On the other hand, a photolithography machine has a lower resolution limit given by $$R = k_1 \times \frac{\lambda}{NA},$$

where λ denotes the wavelength, usually of 365 nm, NA denotes the numerical aperture, usually in the range of 0.32 to 0.5, and $k_1$ denotes the process factor, usually of 0.7 µm. It will be found from a calculation that the lower resolution limit of photolithography machines commonly used in PSS technology is in the range of 0.5 µm to 0.8 µm, greater than a/2. In other words, the distances between the boundaries and adjacent round opaque areas 01 are too small. FIG. 2 shows a light intensity distribution of the light incident on the surface of a photoresist layer when using the photomask with the pattern of FIG. 1 to expose the photoresist. In FIG. 2, the photomask is shown to be placed in an X-Y coordinate system, the dark areas correspond to the opaque areas 01 and the bright area corresponds to the transparent area 02. An actual measurement revealed that the light intensity at the boundaries of the photomask was 50% of the light intensity at the central transparent area 02 of the photomask. This is considered to be a consequence of an optical proximity effect (OPE). Due to the optical proximity effect, in the image formed by exposing the photomask, those portions of the image corresponding to the round opaque areas 01 close to the boundaries of the photomask often present dimensional unevenness or cannot be clearly developed.

Figure 3:
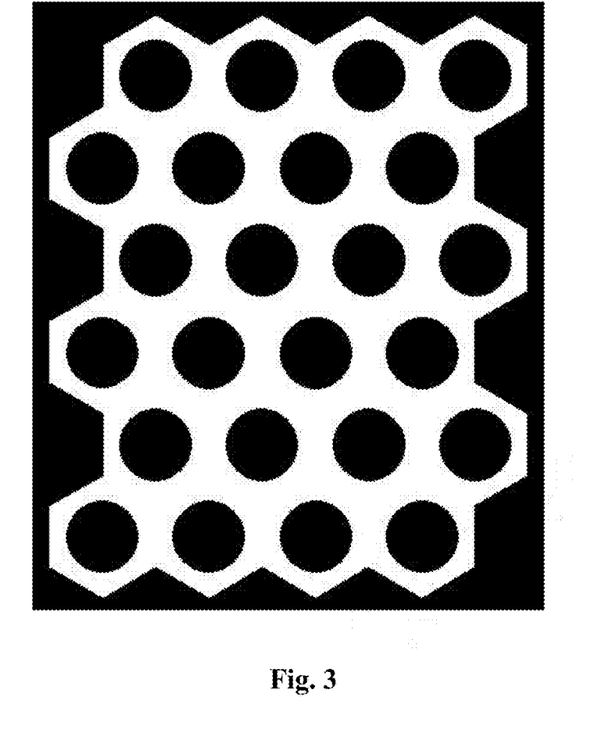
FIG. 3 shows another conventional PSS photomask pattern in which the transparent areas are divided into hexagonal units.
Figure 4:
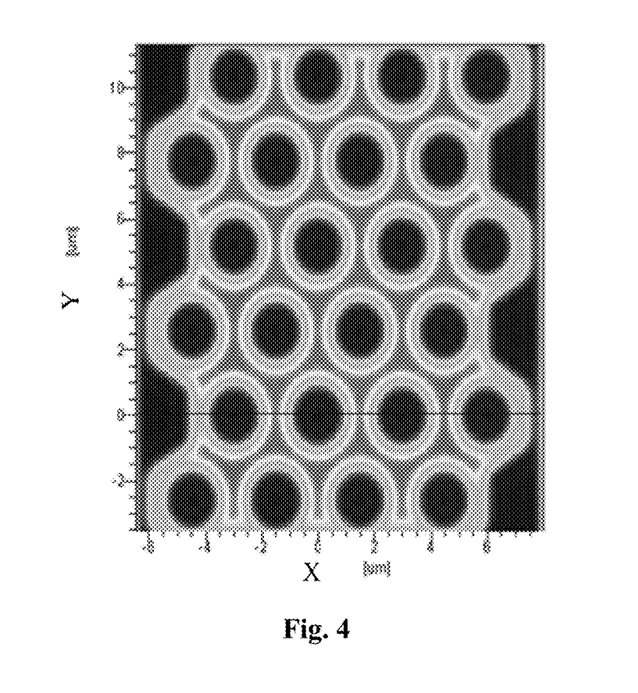
FIG. 4 shows a light intensity distribution during an exposure carried out using the photomask of FIG. 3.

In order to overcome this problem, Chinese Patent Publication No. CN102520576B of Chinese Patent Application No. CN201110367148.5, filed Jun. 27, 2012, proposes a PSS photomask pattern, as shown in FIG. 3, which is made up of hexagonal units. However, in this pattern, a portion of the transparent area between a round opaque area and a boundary of the photomask has a width that is only one half of a distance between adjacent round areas, and the corresponding light intensity distribution is shown in FIG. 4. An actual measurement also revealed that the light intensity at the boundaries of the photomask was 50% of the light intensity at the central area of the photomask. Therefore, this solution fails to solve the aforementioned problem.

Chinese Patent Publication No. CN103365070A of Chinese Patent Application No. CN201210089168.5, filed Oct. 23, 2013, describes a photomask pattern consisting of two sets of holes that are periodically staggered and configured to produce light beams with different phases. While this pattern can produce a clear image, it requires the use of negative photoresist, and accordingly, proper adjustments must be made in the photolithography system, so the process cost is high.

Chinese Patent Publication No. CN103337566A of Chinese Patent Application No. CN201310243141.1, filed Oct. 2, 2013, proposes a method including the steps of: forming a patterned photoresist corresponding to part of a desired substrate pattern on a front side of a sapphire substrate using a photolithography process; depositing a stop layer over the front side of the substrate; removing the photoresist by a lift-off process, such that only the portion of the stop layer on the substrate is retained; forming another patterned photoresist corresponding to the remaining part of the desired substrate pattern by another photolithography process; depositing another stop layer over the substrate; removing the photoresist and the portion of the stop layer thereon using another lift-off process; and etching the sapphire substrate to form the desired substrate pattern by a wet or dry etching process. Although this solution can effectively mitigate the foregoing problem, the process is complex and costs much.

Chinese Patent Publication No. CN103576440A of Chinese Patent Application No. CN201310473082.7, filed Feb. 12, 2014, proposes to modify the opaque areas into plum-like shapes. It has also been proposed in the prior art to use volcano-shaped opaque areas. However, those opaque areas can only improve the light extraction, but still fail to solve the problem of blurred image edges arising from excessively narrow gaps between photomask boundaries and opaque areas.

Therefore, there is a need for a PSS photomask pattern and an exposure method, which can solve the problem of blurred pattern image edges that may arise from too small distances between photomask boundaries and opaque areas while not increasing process complexity and cost.

SUMMARY OF THE INVENTION

It is an objective of the present invention to provide just such a PSS photomask pattern and an exposure method in order to solve the above problems. The pattern has an improved design by containing continuous opaque frames instead of discrete opaque areas too close to the frames or fractional opaque areas on the frames that are prone to giving rise to an optical proximity effect (OPE). This makes the round opaque areas adjacent to the frames immune from the influence of lighting conditions. During the exposure using another identical PSS photomask pattern, one frame of the transferred pattern resulting from the exposure using the first PSS photomask pattern is aligned with an opposing one of the frames of the other PSS photomask pattern so that arcs on the two frames are combined into complete circles. As a result, the opaque areas on the frames may also be exposed in a desired way, and the problem of blurred pattern image edges arising from excessively narrow gaps between photomask frames and opaque areas can be solved without increasing process complexity and cost.

The above objective is attained by a pattern structure of a photomask for a patterned sapphire substrate (PPS) according to the present invention, wherein the pattern structure is formed by stitching a plurality of identical polygons each including at least two sector-shaped opaque areas and one transparent area, wherein the plurality of polygons are joined together by stitching the sector-shaped opaque areas into round opaque areas, wherein each of the plurality of polygons is axisymmetric, wherein the sector-shaped opaque areas in each of the plurality of polygons are defined by arcs having a same radius, wherein in each of the plurality of polygons, a sum of central angles of the arcs that define the sector-shaped opaque areas is equal to 180°, and wherein boundary areas of the photomask that are unable to accommodate a complete one of the polygons are configured as opaque areas.

Preferably, the polygons are pentagons each including two adjacent interior angles that are right angles, wherein sides of the right angles serve as sides of the sector-shaped opaque areas and the right angles constitute the central angles of the arcs that define the sector-shaped opaque areas, wherein the two right angles have two sides opposing each other and having a same length that is equal to the radius of the sector-shaped opaque areas.

Preferably, the polygons are equilateral triangles each having three sector-shaped opaque areas with central angles of 60° formed at three corners of the equilateral triangle.

Preferably, the round opaque areas have a diameter of from 2 μm to 2.3 μm.

Preferably, each of the round opaque areas has a perimeter that is stitched by the arcs of the corresponding sector-shaped opaque areas of the corresponding polygons, and wherein each arc on one side of the photomask is able to form a complete circle with a complementary arc on an opposing side of the photomask.

Preferably, upon superimposing of the boundary areas of two identical photomasks, and on adjacent sides of the two photomasks, the arcs on one of the photomasks are stitched to and form complete circles with complementary arcs on the other one of the photomasks.

The present invention also provides an exposure method using a photomask having the pattern structure of a photomask for a patterned sapphire substrate as defined above, in which after a patterned region is formed by exposing the photomask, the photomask is caused to have boundary areas thereof superimposed with boundary areas of the patterned region such that arcs on one side of the photomask are stitched to and form complete circles with complementary arcs on an opposing side of the patterned region, and then the photomask is exposed again.

Compared with the conventional solutions, the present invention offers the following benefits: the PSS photomask pattern provided in the present invention has an improved design by including: a plurality of identical polygons each including at least two sector-shaped opaque areas and one transparent area, wherein the polygons are joined together so that their sector-shaped opaque areas are combined into round opaque areas, wherein each of the polygons is axisymmetric, wherein all the sector-shaped opaque areas in the polygons are defined by arcs having the same radius, and wherein in each of the polygons, the sum of central angles of the arcs that define the sector-shaped opaque areas is equal to 180°; and opaque frames that surround the polygons. With this design, discrete opaque areas too close to the frames or fractional opaque areas on the frames that are prone to giving rise to an optical proximity effect (OPE) are replaced with continuous opaque frames with irregular shapes. As a result, the round opaque areas adjacent to the frames are immunized from the influence of lighting conditions. Moreover, during the exposure using another identical PSS photomask pattern, one frame of the transferred pattern resulting from the exposure using the first PSS photomask pattern is aligned with an opposing one of the frames of the other PSS photomask pattern so that arcs on the two frames are combined into complete circles. In this way, the opaque areas on the frames may also be exposed in a desired way. These advantages are achieved merely by geometrical modifications to the transparent area without changing exposure steps or parameters. Therefore, the problem of blurred pattern image edges arising from excessively narrow gaps between photomask frames and opaque areas can be solved without increasing process complexity and cost.

In FIGS. 1 to 4: 01—opaque area; 02—transparent area.

In FIGS. 5 to 11: 1—opaque area; 2—transparent area, 3—first unitary triangle; 4—second unitary triangle; 5—third unitary polygon; 6—fourth unitary polygon; 7—opaque area with arcs; 81—first line segment; 82—second line segment; 83—third line segment.

DETAILED DESCRIPTION

The above objectives, features and advantages of the present invention will become more readily apparent upon reading the following detailed description of a few specific embodiments taken in conjunction with the accompanying drawings.

Embodiment 1

The present invention provides a pattern structure of a patterned sapphire substrate (PSS) photomask. The pattern structure includes a number of opaque areas 1 and a transparent area 2. According to this embodiment, the transparent area 2 is divided in the following manner.

Figures 5, 6:
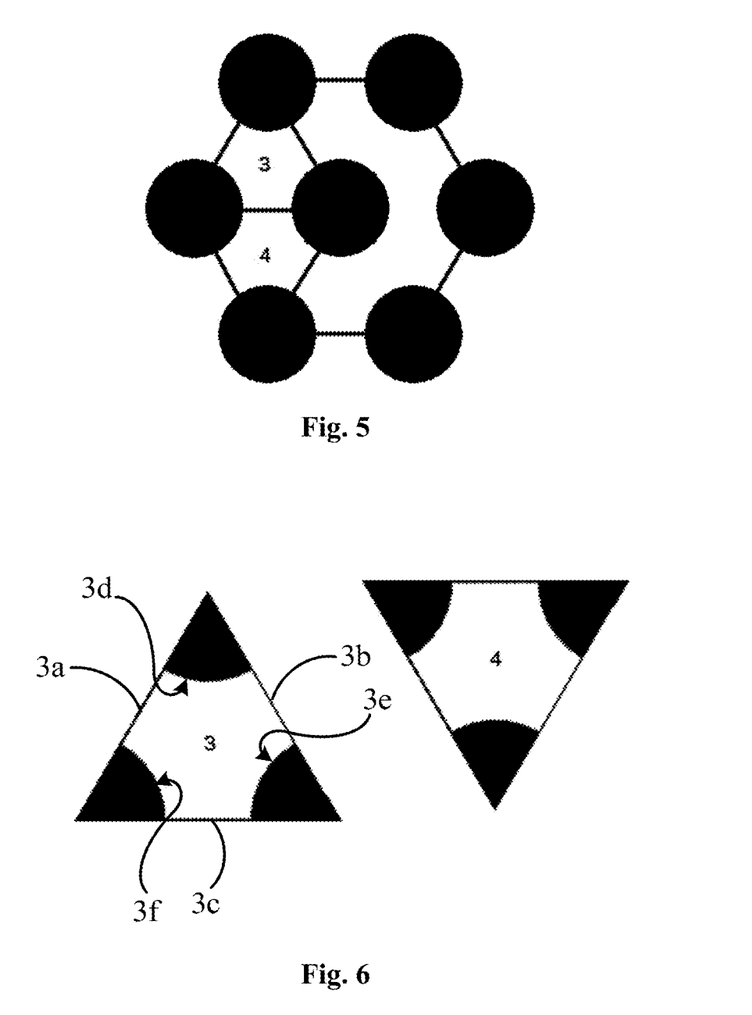
FIG. 5 schematically illustrates how a transparent area is divided in accordance with a first embodiment of the present invention.
FIG. 6 schematically illustrates unitary polygons resulting from the division of the transparent area according to the first embodiment of the present invention.

Referring to FIG. 5, the opaque areas 1 on the photomask are generally round areas that are spaced apart from one another by the transparent area 2. The distances between the round areas are identical and the round areas have the same radius. By connecting centers of three adjacent round opaque areas 1, a first unitary triangle 3 and a second unitary triangle 4 can be obtained as shown in FIG. 5. The first unitary triangle 3 and the second unitary triangle 4, as reflected in FIG. 6, are each an equilateral triangle. The first unitary triangle 3 has three straight sides 3a, 3b, 3c and three arc sides 3d, 3e, 3f, and each of the arc sides 3d, 3e, 3f is part of the perimeter of a corresponding one of the three adjacent round areas. Additionally, central angles of the three arc sides, i.e., the interior angles of the equilateral triangle, are all 60°. Therefore, the sum of the central angles of the three arc sides, i.e., the sum of the interior angles of the equilateral triangle, is equal to 180°. The second unitary triangle 4 is structurally the same as the first unitary triangle 3.

Figure 7:
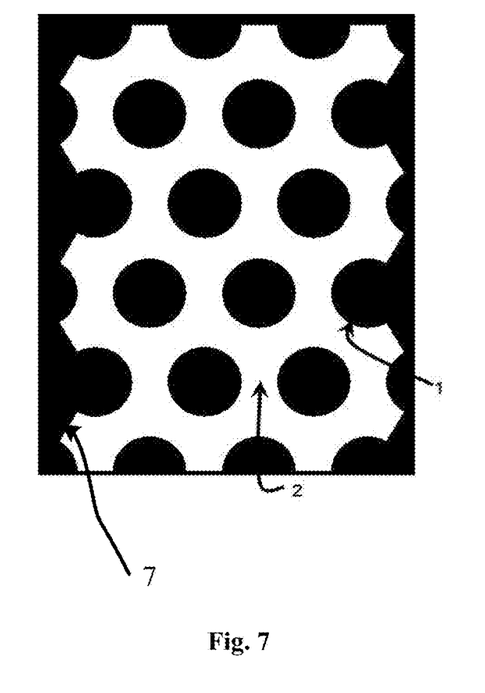
FIG. 7 is a schematic illustration of a pattern structure of a PSS photomask according to the first embodiment of the present invention.
Figure 8:
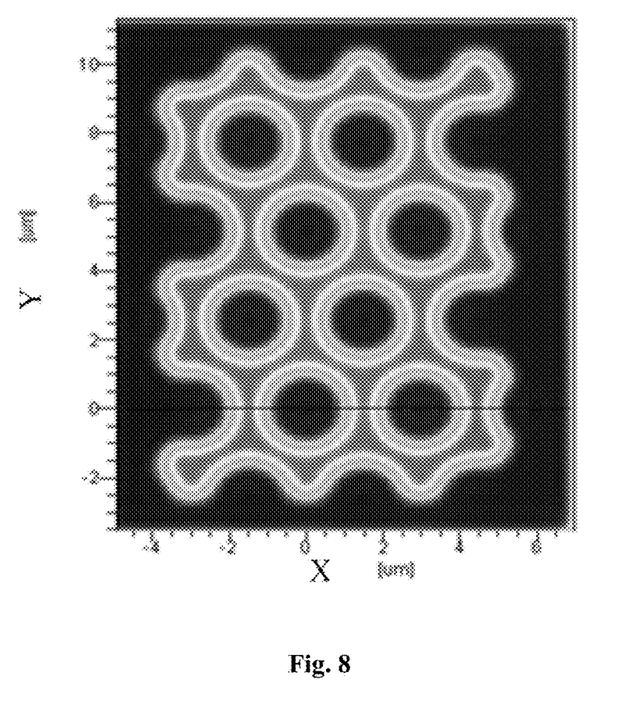
FIG. 8 shows a light intensity distribution during an exposure carried out using the photomask of FIG. 7.

If a transparent area 2 of the photomask is to be formed by stitching the transparent portions within the first and second unitary triangles 3, 4, there would have been boundary areas that are unable to accommodate a complete first unitary triangle 3 or a complete second unitary triangle 4 on both sides (i.e. the left and right sides shown in the figure) of the photomask. In such cases, the boundary areas that are unable to accommodate complete first unitary triangles 3 or second unitary triangles 4 are designed as opaque areas 1. As a result, as shown in FIG. 7, an opaque area with arcs 7 is formed along each side of the photomask by connecting the round opaque areas 1 close to the side. When being exposed, the opaque area with arcs 7 on both sides will not result in complete circular images. A light intensity distribution during the exposure is shown in FIG. 8.

Figure 9:
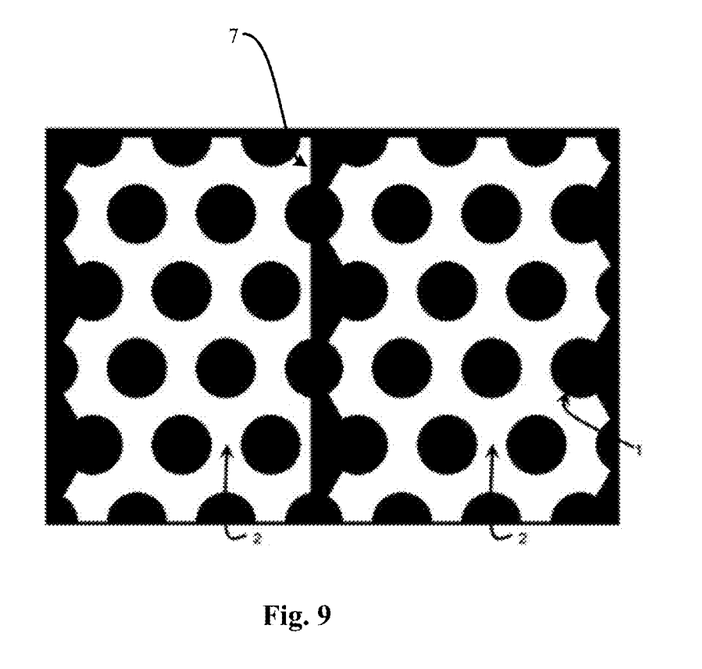
FIG. 9 schematically illustrates a superimposition of two photomasks according to the first embodiment of the present invention at their boundary areas.

The present invention also provides an exposure method using a photomask having a pattern structure of the above PSS photomask. Referring to FIG. 9, after one exposure using the photomask is completed, another exposure is performed using an identical photomask that is superimposed with the previous photomask in boundary areas. Alternatively, after a patterned region is formed by exposing a previous photomask, another exposure may be performed by superimposing boundary areas of another photomask with boundary areas of the patterned region. During exposure, the opaque areas with arcs 7 are overlapped such that the arcs on corresponding sides form complete circles. Referring to FIG. 9, when superimposing a second photomask on the opaque area with arcs 7 of the first photomask, the opaque area with arcs 7 of the second photomask may block away part of the illumination light during exposure. However, as the blocked areas have been exposed during the previous exposure using the first photomask, even if a portion of the transparent area 2 in boundary areas of the first photomask is covered by the opaque area with arcs 7 of the second photomask during the subsequent exposure using the second photomask, the images obtained from the exposure of these two photomasks will not be affected.

Preferably, the round opaque areas 1 have a diameter ranging from 2 μm to 2.3 μm.

Embodiment 2

Figure 11:
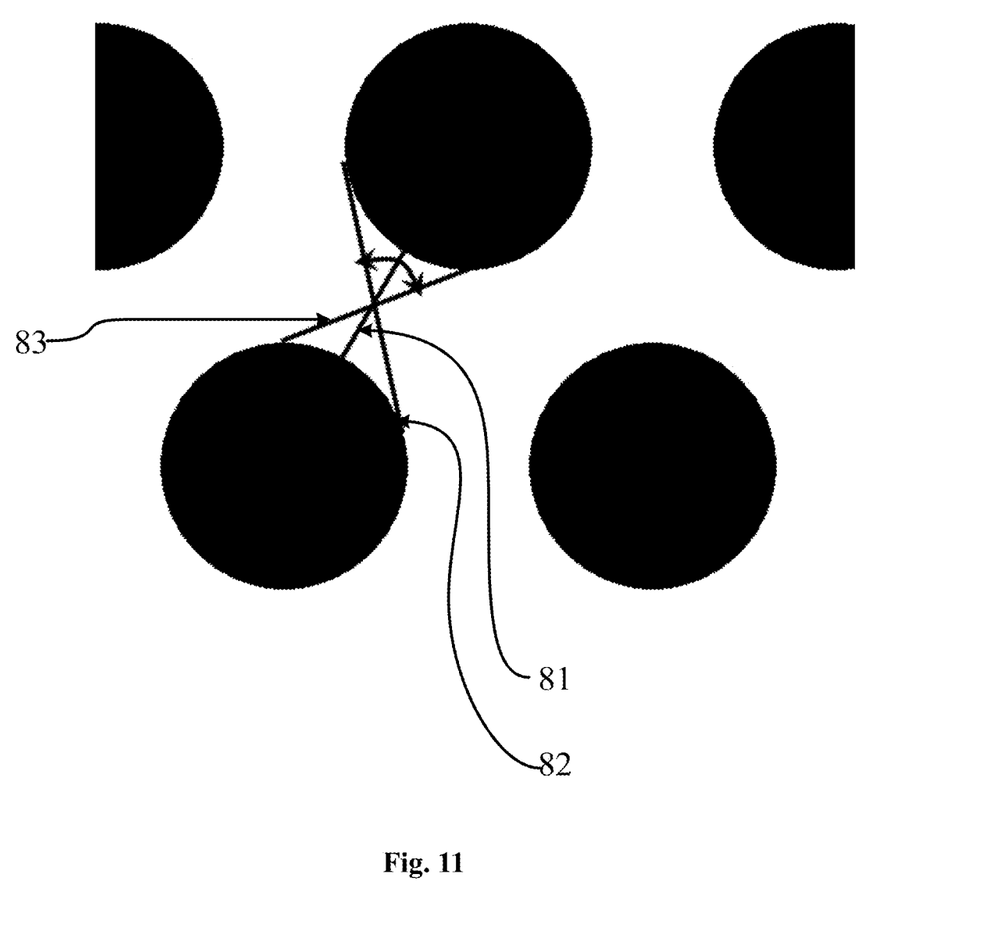
FIG. 11 schematically illustrates how the division of the transparent area is performed in accordance with the second embodiment of the present invention.

Referring to FIG. 11, the line segments connecting centers of the round opaque areas are defined as first line segments 81. This Embodiment differs from Embodiment 1 in that the transparent area 2 is divided by second line segments 82 or third line segments 83, wherein the second and third line segments 82, 83 are inclined with respect to the corresponding first line segments 81 at an angle of 38°-42°.

Figure 10:
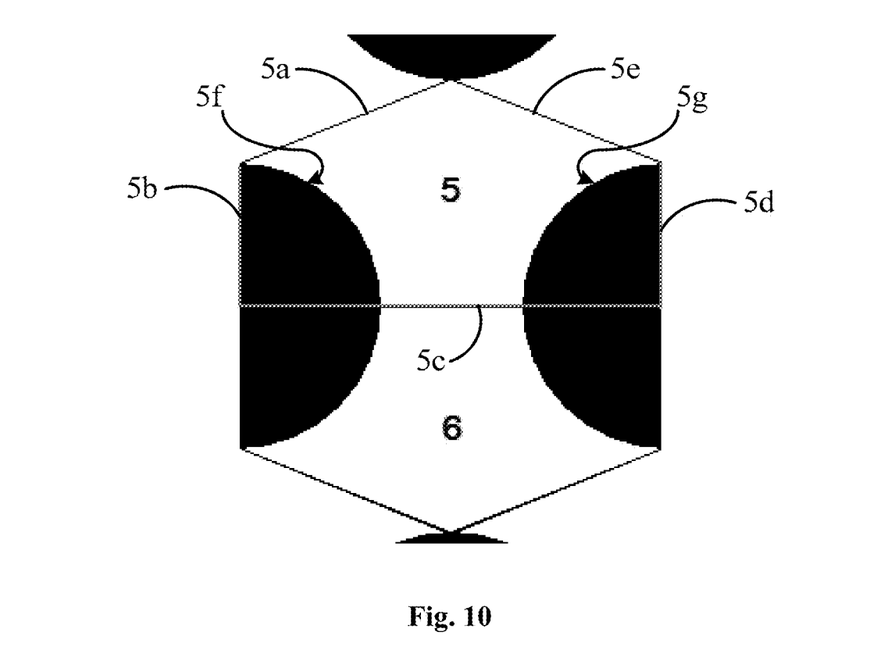
FIG. 10 is a schematic illustration of a unitary polygon resulting from the division of a transparent area according to a second embodiment of the present invention.

For example, the transparent area 2 is divided by the third line segments 83 into third unitary polygons 5 and fourth unitary polygons 6, as shown in FIG. 10. Each of the third unitary polygons 5 has five straight sides 5a to 5e and two adjacent right-angle corners. These two adjacent right-angle corners correspond to two arcs 5f, 5g each having a central angle of 90°, and hence two quarter circles are formed. Both of the quarter circles are opaque areas. The sum of the central angles of the arcs 5f, 5g is equal to 180°. The two right-angle corners have two opposing straight sides 5b and 5d. A length of these two straight sides 5b and 5d equals to the radius of the quarter circle. The fourth unitary polygons 6 are structurally the same as the third unitary polygons 5. The transparent area 2 of the photomask is formed by stitching transparent portions of the third and fourth unitary polygons 5, 6, and the rest portions constitute the opaque areas 1. This may ensure that the exposure of the round opaque areas 1 adjacent to the boundaries is not affected by the lighting conditions at the boundaries. Moreover, round opaque areas 1 at the boundaries can be exposed into complete images by superimposing two photomasks at their boundary areas or by superimposing boundary areas of another photomask with boundary areas of the patterned region formed by exposing a previous photomask.

The present invention divides the transparent area into geometrical units and then stitch them together. When a region between a side of the photomask and a round opaque area 1 adjacent to this side is unable to accommodate a complete pentagon or equilateral triangle transparent area 2, an irregularly-shaped opaque area 1 is formed by connecting the opaque area with arcs 7 with the side. As a result, the round opaque areas 1 adjacent to the sides are immunized from the influence of lighting conditions. Moreover, during the exposure of another photomask, it may be superimposed with boundary areas of the patterned region resulting from the exposure of the first photomask so as to allow the exposure of round opaque areas 1 adjacent to the boundaries of the photomask. These advantages are achieved without changing any exposure step or parameter. Therefore, the problem of blurred pattern image edges arising from excessively narrow gaps between photomask boundaries and opaque areas can be solved while not increasing process complexity and cost.

While the present invention has been described above with reference to the foregoing several embodiments, it is not limited to these embodiments. It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A pattern structure of a photomask for a patterned sapphire substrate (PPS), wherein the pattern structure is formed by stitching a plurality of identical polygons each comprising at least two sector-shaped opaque areas and one transparent area, wherein the plurality of polygons are joined together by stitching the sector-shaped opaque areas into round opaque areas, wherein each of the plurality of polygons is axisymmetric, wherein the sector-shaped opaque areas in each of the plurality of polygons are defined by arcs having a same radius, wherein in each of the plurality of polygons, a sum of central angles of the arcs that define the sector-shaped opaque areas is equal to 180°, and wherein boundary areas of the photomask that are unable to accommodate a complete one of the polygons are configured as opaque areas.

2. The pattern structure of a photomask for a PPS of claim 1, wherein the plurality of polygons are pentagons each comprising two adjacent interior angles that are right angles, wherein sides of the right angles serve as sides of the sector-shaped opaque areas and the right angles constitute the central angles of the arcs that define the sector-shaped opaque areas, wherein the two right angles have two sides opposing each other and having a same length that is equal to the radius of the sector-shaped opaque areas.

3. The pattern structure of a photomask for a PPS of claim 1, wherein the plurality of polygons are equilateral triangles each having three sector-shaped opaque areas with central angles of 60° formed at three corners of the equilateral triangle.

4. The pattern structure of a photomask for a PPS of claim 1, wherein the round opaque areas have a diameter of from 2 μm to 2.3 μm.

5. The pattern structure of a photomask for a PPS of claim 1, wherein each of the round opaque areas has a perimeter that is stitched by the arcs of the corresponding sector-shaped opaque areas of the corresponding polygons, and wherein each arc on one side of the photomask is able to form a complete circle with a complementary arc on an opposing side of the photomask.

6. The pattern structure of a photomask for a PPS of claim 5, wherein upon superimposing of the boundary areas of two identical photomasks, and on adjacent sides of the two photomasks, the arcs on one of the photomasks are stitched to and form complete circles with complementary arcs on the other one of the photomasks.

7. An exposure method using a photomask having the pattern structure of a photomask for a patterned sapphire substrate as defined in claim 1, wherein after a patterned region is formed by exposing the photomask, the photomask is caused to have boundary areas thereof superimposed with boundary areas of the patterned region such that arcs on one side of the photomask are stitched to and form complete circles with complementary arcs on an opposing side of the patterned region, and then the photomask is exposed again.

* * * * *